(12) United States Patent
Doffin

(10) Patent No.: US 8,416,548 B2
(45) Date of Patent: Apr. 9, 2013

(54) DEVICE FOR CONTROLLING A MOS TRANSISTOR

(75) Inventor: Hugues Doffin, Creteil (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 12/161,207

(22) PCT Filed: Dec. 19, 2006

(86) PCT No.: PCT/FR2006/051392
§ 371 (c)(1),
(2), (4) Date: Jul. 1, 2010

(87) PCT Pub. No.: WO2007/083008
PCT Pub. Date: Jul. 26, 2007

(65) Prior Publication Data
US 2010/0270894 A1    Oct. 28, 2010

(30) Foreign Application Priority Data

Jan. 23, 2006   (FR) ...................................... 06 00572

(51) Int. Cl.
*H02H 3/16* (2006.01)
*H02H 11/00* (2006.01)
(52) U.S. Cl. .............. 361/91.1; 361/56; 361/42; 361/49
(58) Field of Classification Search ............. 361/1, 91.1, 361/56, 42, 49
See application file for complete search history.

(56) References Cited

U.S. PATENT DOCUMENTS

| | | | | |
|---|---|---|---|---|
| 4,055,777 A | * | 10/1977 | Black ............................. | 327/85 |
| 4,297,629 A | * | 10/1981 | Godard et al. ................ | 320/117 |
| 5,408,150 A | | 4/1995 | Wilcox | |
| 5,629,542 A | * | 5/1997 | Sakamoto et al. ............ | 257/328 |
| 5,686,814 A | * | 11/1997 | Wierzbicki ..................... | 307/51 |
| 6,031,365 A | * | 2/2000 | Sharpe-Geisler ............. | 323/313 |
| 6,222,751 B1 | | 4/2001 | Portaluri et al. | |
| 7,408,796 B2 | * | 8/2008 | Soldano ........................ | 363/127 |
| 7,561,391 B2 | * | 7/2009 | Mirea et al. .................... | 361/56 |
| 2001/0030880 A1 | | 10/2001 | Miyazaki et al. | |
| 2004/0085117 A1 | | 5/2004 | Melbert et al. | |

OTHER PUBLICATIONS

Linear Circuit Data Book, 1989, Texas Instruments, Inc., pp. 2-51, 52, 2-143, 144.*
Reese et al."A Smart synchronous rectifier for 12 V automobile alternator", Jun. 15-19, 2003, Power Electronics Specialist Conference 2003, PESC '03. 2003 IEEE, 34th Annual, pp. 1516-1521, vol. 4.*

* cited by examiner

*Primary Examiner* — Rexford Barnie
*Assistant Examiner* — Zeev V Kitov
(74) *Attorney, Agent, or Firm* — Berenato & White, LLC

(57) ABSTRACT

A device for controlling a transistor, the device comprising an amplifying device (15) for controlling the transistor gate via an output control signal, the device including a first input connected to the transistor drain, the whole assembly forming a first connection, a second input connected to the transistor source, the whole assembly forming a second connection. The control device also comprises: at least one protecting device including at least one switching element (T1) which is inserted in series in the first connection of the amplifying device (15) to prevent a leakage current from passing through the first connection, and a device generating a regulating voltage to control the transistor, the generating device being configured such that there exists the same number of semiconductor junctions between the first and second connections. The invention is in particular applicable on battery charging devices.

9 Claims, 5 Drawing Sheets

DEVICE FOR CONTROLLING A MOS TRANSISTOR

CROSS-REFERENCE TO RELATED APPLICATIONS AND CLAIM TO PRIORITY

This application relates to International Application No. PCT/FR2006/051392 filed Dec. 19, 2006 and French Patent Application No. 0600572 filed Jan. 23, 2006, of which the disclosures are incorporated herein by reference and to which priority is claimed.

FIELD OF THE INVENTION

The present invention concerns a device for controlling an MOS (MOSFET) transistor.

Such a control device is for example used in the context of a rotary electrical machine, for example an alternator or alternator starter.

An alternator starter comprises conventionally:
- a rotor representing a field winding into which an excitation current is brought, and
- a polyphase state representing an armature and comprising several phases.

The alternator starter functions in motor mode or generator mode. This is a so-called reversible machine.

In generator mode, also referred to as alternator mode, the machine converts a rotation movement of the rotor driven by the thermal engine of the vehicle into an electrical current induced in the phases of the stator. In this case, a bridge rectifier connected to the phases of the stator rectifies the sinusoidal induced current into a direct current in order to supply consumers of the vehicle such as the battery. Such a bridge comprises one arm per phase, an arm comprising two MOSFET transistors in general.

On the other hand, in motor mode, the electrical machine serves as an electric motor for driving the thermal engine of the vehicle in rotation, via the rotor shaft. It converts electrical energy into mechanical energy. In this case, the power unit forms an inverter for transforming a direct current into an alternating current, which makes it possible to generate a motor torque.

BACKGROUND OF THE INVENTION

In the document entitled "New Gate Control Unit for Automotive Synchronous Rectifiers", authors Stephan Rees and Ulrich Ammann, published by the Institute of Power Electronics and Control Engineering, University of Stuttgart, there is shown a control device for suitably controlling the transistors of the bridge rectifier in order to correctly rectify the sinusoidal induced current.

A control device is connected to each transistor of the bridge rectifier/inverter. The control device comprises an operational amplifier for controlling the associated transistor.

One of the drawbacks of this device is that it is subjected to the leakage currents coming from the battery.

Because of this, the transistors of the bridge rectifier/inverter may be damaged because of these leakage currents and, when the vehicle is stopped, the bridge rectifier/inverter continuously consumes current, which may discharge the battery.

SUMMARY OF THE INVENTION

The purpose of the present invention is in particular to mitigate these drawbacks.

The invention proposes a device for controlling a transistor that limits the leakage current so that the transistor functions correctly and so that the battery does not discharge when the vehicle is stopped.

The invention thus proposes a device for controlling a transistor formed by a channel comprising a gate, a source and a drain, the said device comprising an amplification device for controlling the gate of the transistor by means of an output control signal, the said device comprising a first input connected to the drain of the transistor, the whole forming a first connection, a second input connected to the source of the transistor, the whole forming a second connection.

According to the invention, the control device also comprises:
- at least one protection device comprising at least one switching element that is inserted in series in the said first connection of the amplification device in order to prevent the passage of a leakage current through the said first connection, and
- a device for generating a regulation voltage for controlling the transistor, the said generation device being configured so that there exists the same number N of semiconductor junctions between the first and second connections.

Thus this protection device will block the leakage currents so that no leakage current can escape from the battery and go into the said device. In this way, when the vehicle is stopped, there is no risk that the battery will discharge and the bridge rectifier/inverter consumes nothing.

According to non-limitative embodiments, the device according to the invention can comprise one or more of the following characteristics:
- the control device for a transistor also comprises a feedback loop from the output to one of the inputs;
- the control device for a transistor also comprises a protection device coupled to the feedback loop;
- the protection device also comprises a diode;
- the protection device comprises a switch;
- the protection device is associated with a supply source intended to bias the said protection device by means of a current;
- the first input of the amplification device is the negative input and the second input is the positive input;
- the control device is implemented in an integrated circuit comprising or not the said transistor;
- the junction or junctions on the first connection is or are of the same nature as the one or ones on the second connection;
- the number of junctions N is equal to 0;
- the number of junctions N is equal to 1;
- the device generating the regulation voltage includes the protection device.

The invention also proposes a system for managing two batteries for a motor vehicle, comprising first and second control devices respectively for first and second transistors, the said devices being intended to put the batteries in parallel, the first control device being characterised according to one of the preceding characteristics.

The second control device comprises a control for the second transistor in two-state mode.

The invention also comprises a power bridge for a polyphase rotary electrical machine comprising at least one bridge arm composed of transistors, the bridge arm being associated with a phase of the machine, and one control device per transistor according to one of the preceding characteristics.

The invention also proposes a rotary electrical machine comprising a system for managing two batteries according to one of the preceding characteristics.

The invention also proposes a rotary electrical machine comprising a power bridge according to one of the preceding characteristics.

BRIEF DESCRIPTION OF THE DRAWINGS

Other particularities and advantages of the present invention will emerge from the following description of non-limitative embodiments, with reference to the accompanying drawings, in which.

DETAILED DESCRIPTION OF EMBODIMENTS OF THE INVENTION

Figure 1:
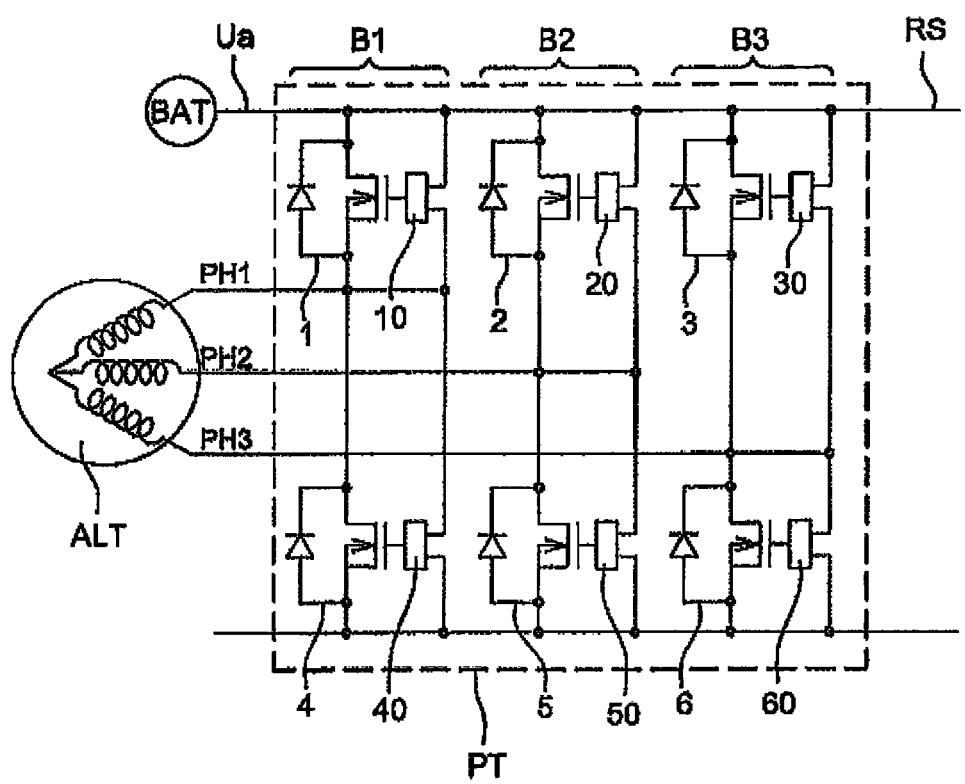
FIG. 1 is a first diagram of an exemplary embodiment of a circuit in which a device according to the invention can be used in the context of a first application.

A control device 10 for a power transistor can be used in a bridge rectifier of an alternator starter as illustrated in FIG. 1.

The control device 10 is described in the context of this application. Naturally the application is only a non-limitative example of an application for the control device 10. The control device 10 can be used in other applications, as will be seen in detail below.

FIG. 1 depicts a power bridge PT connected to an alternator starter ALT and to an onboard system RS of a motor vehicle and to a battery BAT that supplies the said bridge rectifier by means of a voltage Ua. The power bridge PT comprises three arms, B1, B2 and B3, each arm being composed of two power transistors 1 to 6 and being connected to a phase PH1, PH2, PH3 of the stator of the alternator starter.

A control device 10 is associated with each of the power transistors 1-6 of the power bridge PT in order to make a transistor switch so as to obtain either the rectification of the alternating current (bridge rectifier function) or to obtain a mechanical motor torque (inverter function).

In the remainder of this description a single control device is described, wherein all the devices of the power bridge being identical in this example.

Figure 2:
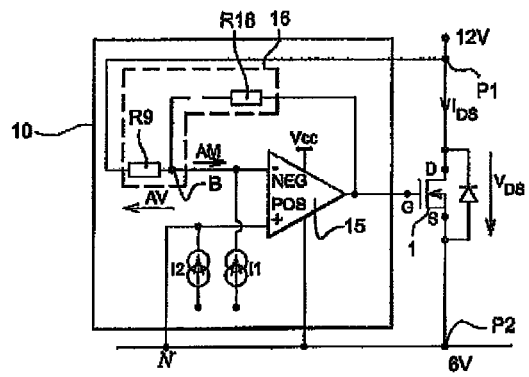
FIG. 2 is a first functional diagram of the control device according to the invention.

FIG. 2 presents a first example of a functional diagram of the control device 10. In this diagram, it can be seen that the control device 10 comprises:

an amplification device 15 for controlling a gate G of the power transistor 1 by means of an output control signal, the said device comprising:
a first input NEG (−) coupled to a drain D of the power transistor through a first resistor R9, together forming a first connection, and
a second input POS (+) connected to the source S of the transistor and forming a second connection,
at least one biasing current I1 coupled to one of the first and second inputs, here the first input NEG, the biasing current I1 is intended to shift the measurement of the drain-source voltage, called a regulation voltage Vr, so that the amplification device functions in a linear mode before opening the transistor, and
a protection device for protecting against leakage currents (not shown in this figure).

It should be noted that the biasing current is supplied by a supply source allowing biasing the protection device by means of a current.

In a non-limitative embodiment, the control device 10 also comprises a feedback loop 16 from the output of the amplification device 15 to one of its inputs, here to the first input NEG. The feedback loop comprises a second resistor R18. This loop controls the transfer function of the amplification device 15, in particular its gain, by re-injecting a feedback current. In addition, the second resistor R18 allows a limitation in the gain of the feedback loop by choosing given values for the first and second resistors R9 and R18.

In a non-limitative embodiment, the first input NEG of the amplification device 15 is the negative input and the second input POS is the positive input. In a variant, this may be the opposite; at this moment the feedback loop 16 comprises an inverter gate.

Figure 3:
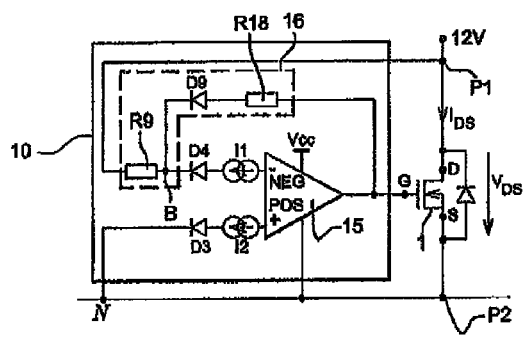
FIG. 3 is a first exemplary embodiment of a protection device included in the control device of FIG. 2.

It should be noted that the biasing currents I1, I2 are produced for example by a current source or by a resistor connected to a fixed potential. In addition, the biasing currents I1, I2 can be integrated in the amplification device 15, as indicated in FIG. 3. They will thus also serve for the amplification performed by the amplification device 15. Thus it is not necessary to add an external circuit. These biasing currents may be different. In the rest of the figures, the biasing currents I1, I2 are shown integrated. However, they may of course be external. FIG. 3 shows a first embodiment of a protection device. According to this embodiment, the protection device comprises at least one diode placed on the input of the amplification device 15.

Where no feedback loop 16 exists, in a non-limitative embodiment, there exists a single protection diode D4 placed on one of the inputs of the amplification device 15, here the negative input NEG, upstream of the point B (the point connecting the first resistor R9 to the first input NEG of the amplification device 15).

In the embodiments including the feedback loop 16 exists, in a non-limitative embodiment, the control device 10 includes a first (or protection) diode D4 and a second (or feedback) diode D9 on the feedback loop 16. The feedback (or second) diode D9 makes it possible to block a high drain voltage, here 12V, and to block a leakage current coming from the drain that might discharge the battery.

It should also be noted that there exists, in a non-limitative embodiment, a third diode D3 on the positive input POS of the amplification device for equalising the voltages between the two inputs. The third diode D3 is chosen so that it has the same intrinsic characteristics, such as the voltage-current characteristic and a function of temperature, as the protection (or first) diode D4. It may either be identical or different but with the same characteristics. This allows the compensation of a difference voltage (offset) generated by the protection (or first) diode D4, an offset voltage that might impair the precise measurement of the drain-source voltage and therefore the control of the regulation voltage. In addition, this third diode D3 has another biasing current I2 coupled to the second input, here POS, passing through it. Thus, there is perfect symmetry (same number of junctions and components of the same nature) of the semiconductor junctions on the two inputs POS and NEG.

In a first non-limitative embodiment, the level of the biasing currents and the characteristics of the diodes are chosen so that the voltages at the terminals of these diodes are identical. Thus the regulation voltage Vr is constant as a function of temperature and is defined mainly by the first biasing current I1 that passes through the first resistor R9. It is possible for example to take biasing currents I1 and I2 identical and constant for any supply voltage of the control device, and the diodes D3 and D4 identical. Thus the offset, which would further offset the drain-source voltage measurement for the transistor 5, is eliminated.

In a second non limitative embodiment, the level of the biasing currents and the characteristics of the diodes are chosen so that the voltages at the terminals of these diodes are different. Thus the regulation voltage Vr is a function of the temperature so as to increase in absolute value and is defined mainly by the first biasing current I1 that passes through the first resistor R9 and the diode D4 and by the second biasing current I2 that passes through the diode D3. It is possible for example to take different biasing currents I1 and I2 and the diodes D3 and D4 identical. This second mode makes it possible to keep operation in linear mode before the opening of the transistor 1 even at high temperatures since the MOS transistor 1 has its internal resistance increasing with temperature. Consequently the time when the gate of the transistor 1 is discharged is advanced compared with the case where the regulation voltage Vr has remained identical to that of the lower temperature. Thus the gate of the transistor 1 has the time to discharge correctly before the current reverses in the transistor 1. Thus electromagnetic interference is limited. There is thus this time a controlled offset that varies according to the temperature of the diodes.

Thus, by virtue of the diodes D3 and D4, and possibly the associated biasing currents I1 and I2 (the case in FIG. 2 where the currents are external to the amplification device 15), an equal number N of semiconductor junctions are obtained between the drain and source inputs of the transistor and the first stage of the amplification device 15. Therefore here N=1. This thus makes it possible to have a very low regulation voltage Vr (around 40 mV) compared with the voltage of a diode (around 0.7V). There are therefore less Joule losses and therefore better efficiency of the machine. It should be noted that N may be equal to 0, as will be seen subsequently. There are always an equal number of junctions.

In addition, by choosing components of the same nature on the two inputs (diode D4-diode D3 and current I1-current I2), they can easily be chosen with the same characteristics and therefore good symmetry on the two inputs can be obtained. This makes it possible easily to adjust the regulation voltage Vr, either according to temperature (when I1 is different from I2) or at a given constant value (I1=I2).

Consequently, by virtue of the equal number of semiconductor junctions and this symmetry, it is easy to choose the regulation voltage Vr even with a very low value without offset voltages coming from the said components chosen and generated by temperature drifts occurring.

By convention, the upstream of the point B is represented by the arrow AM and the downstream of the point by the arrow AV.

It should be noted that the first and second diodes D4 and D9 are placed where there are leakage currents when the bridge rectifier/inverter is off, namely:
leakage current coming from the battery blocked by the second diode D9,
leakage current coming the battery blocked by the first diode D4.

This protection device with diodes placed as described above also makes it possible to block the leakage currents when the bridge rectifier/inverter is on or off.

Thus, the control device 10 of FIG. 3 is one limitative example among others.

For example, it would be possible to have the first and third diodes D4, D3 directly connected to the source S and drain D of the power transistor 1 downstream of the point B, while the feedback loop 16 is directly connected to the amplification device 15 (not shown).

It would also be possible to replace the diodes with MOS-FET transistors. When the bridge rectifier/inverter is off, these transistors would be open, whilst when on these transistors would be as required be closed or on depending on respectively whether or not a leakage current is accepted.

Figure 4:
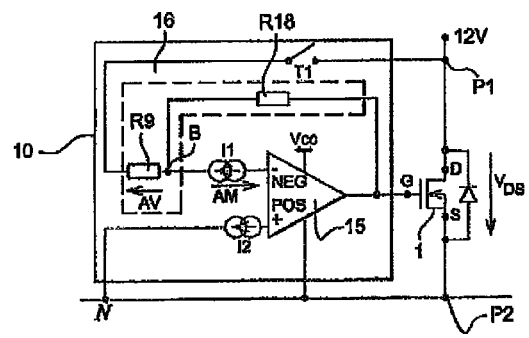
FIG. 4 is a second exemplary embodiment of the protection device included in the control device of FIG. 2.

FIG. 4 shows a second embodiment of a protection device [[D]]. According to this embodiment, the protection device is a switch T1 placed on the first connection of the amplification device 15, downstream of the point B.

The switch T1, which can be in the form of a transistor, is open when no current is flowing in the bridge rectifier/inverter (vehicle stopped). Thus no leakage current can flow from the battery to the amplification device 15 and bridge rectifier/inverter. The transistor T1 is closed when there exists a current flowing in the bridge rectifier/inverter (machine in alternator mode or motor mode).

Figure 5:
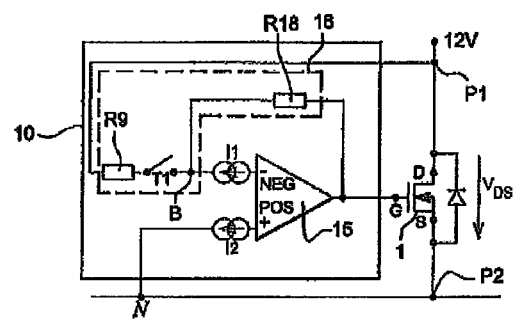
FIG. 5 is a variant of the second exemplary embodiment of the protection device included in the control device of FIG. 2.

In a variant illustrated in FIG. 5, the protection transistor T1 is placed after the first resistor R9.

Figure 6:
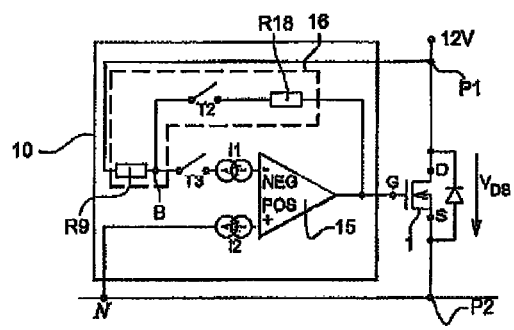
FIG. 6 is a third exemplary embodiment of the protection device included in the control device of FIG. 2.

FIG. 6 shows a third embodiment of a protection device. According to this embodiment, the protection device comprises a first switch T2 placed on the feedback loop 16 of the amplification device 15 and a second switch T3 placed on the first connection.

Thus, when a leakage current coming from the battery exists, the two switches T2 and T3 are opened so that the leakage current does not disperse in the amplification device and bridge rectifier/inverter.

In a first variant, the second switch T3 is placed between the first input NEG of the amplification device 15 and the point B, that is to say upstream of the point B.

In a second variant, the second switch T3 is placed between the point B and the resistor R9 of the first connection, that is to say downstream of the point B.

Figure 7:
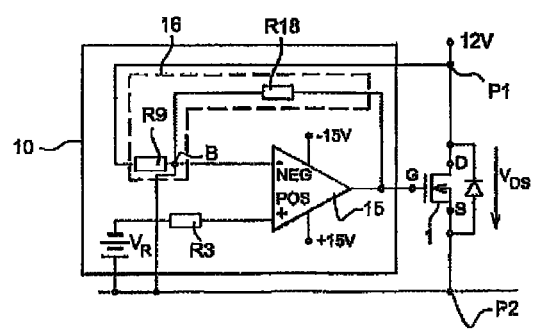
FIG. 7 is a second functional diagram of the control device according to the invention.

FIG. 7 presents a second example of a functional diagram of a control device. On this diagram, it can be seen that the control device 10 comprises:
an amplification device 15 for controlling the gate G of the transistor 1 via an output control signal, the said device comprising:
a first input NEG (−) coupled to the drain D of the power transistor comprising a first resistor R9 and forming a first connection, and
a second input POS (+) connected to the source S of the transistor, by means of a regulation voltage Vr, and comprising a third resistor R3 so as to form a second connection,
a feedback loop 16 comprising a second resistor R18, and a protection device (not shown in this FIG. 7) for protecting against leakage currents.

It should be noted that, in this mode, the regulation voltage is external to the amplification device 15.

Moreover, it should be noted that the resistor R3 makes it possible to have the same symmetry between the inputs of the transistor and the first stage of the amplification device 15. It therefore makes it possible to avoid offset voltages between the first connection and the second connection and therefore not to bias the value of the external regulation voltage Vr. Moreover, this facilitates the obtaining of a constant regulation voltage when I1=I2.

It should be noted that this symmetry between the resistances on the first connection and second connection can be applied to all the embodiments of the present invention.

The embodiments of the protection device are the same as in the first functional diagram of the control device 10.

Figure 8:
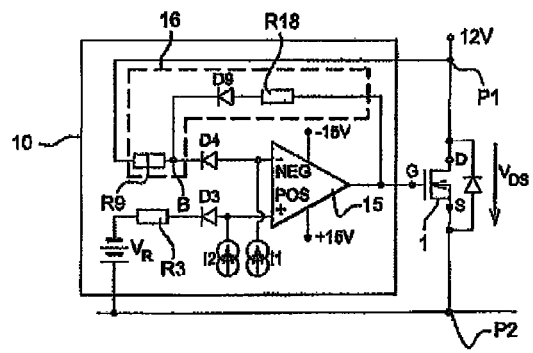
FIG. 8 is a first exemplary embodiment of the protection device included in the control device of FIG. 7.
Figure 9:
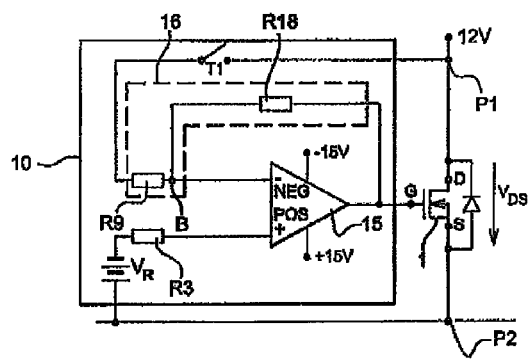
FIG. 9 is a second exemplary embodiment of the protection device included in the control device of FIG. 7.

Thus, in FIG. 8, the protection diodes can be seen, while in FIG. 9 a first protection switch T1 on the first connection can be seen. The other embodiments in FIGS. 5 and 6 seen in the first functional diagram are also applicable but not shown in figures.

It should be noted that this protection device applied to this second functional diagram makes it possible to completely cancel out the leakage current unlike other solutions in which the leakage current is permanent, for example in the case where a protection diode is put on a wire connecting the point B to the source S of the transistor 1. Moreover, these solutions presented make it possible to obtain a great gain without for all that having an excessively high resistance R in the feedback loop.

It should be noted that, in the case where the protection device is implemented with a switch, when this switch is closed, the number of junctions in the first and second connections is 0. N=0.

Figure 10:
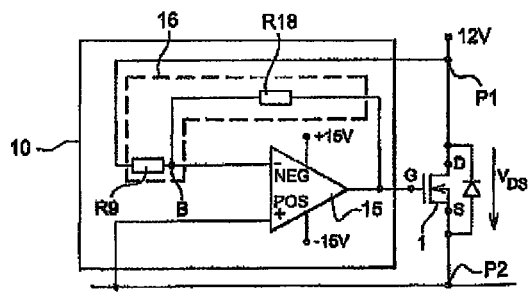
FIG. 10 is a third functional diagram of the control device according to the invention.

FIG. 10 presents a third example of a functional diagram of the control device. In this diagram, it can be seen that the control device 10 is the same as in the first functional diagram except concerning the amplification device 15, which is here a standard component supplied at −15V, +15V.

The embodiments of the protection device are the same as in the first functional diagram of the control device 10.

It should be noted that, for the various functional diagrams presented above, in the case where a control device 10 does not a have feedback loop, only one protection device, diode or switch, is necessary.

The control device 10 has been described according to the application of a power bridge. However, this application is not limitative. This is because the control device 10 for a transistor may also be used in a battery charging device illustrated in FIG. 11.

Figure 11:
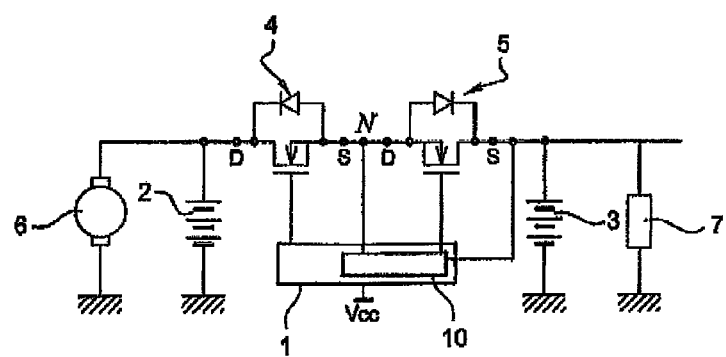
FIG. 11 is a second diagram of an exemplary embodiment of a circuit in which a device according the invention can be used in the context of a second application.

In this application, as illustrated in FIG. 11, a control unit 1 controls the charging of the batteries 2 and 3 by means of power MOS transistors 4 and 5, the conduction paths of which are disposed in series. The battery 2 is for example connected to an alternator 6 or starter or alternator-starter, and the battery 3 is connected to an onboard system. The battery 3 is connected in parallel with the battery 2 by means of the transistors 4 and 5, the transistor 4 being disposed on the same side as the battery 2 and the transistor 5 being disposed on the same side as the battery 3. These transistors are controlled by the control unit 1 as switches, for example on the basis of an external control signal. The transistors 4 and 5 are connected so that their parasitic diodes are arranged with their cathodes turned respectively towards the battery 2 and towards the battery 3. Thus, when the two transistors are in the off (open) state, no current can flow from one battery to the other. This control unit 1 comprises a control device 10.

The control device 10 controls the transistor 5 in a self-contained fashion so that it functions as a perfect diode, while the transistor 4 is controlled by an external signal, in two-state control.

The functioning of the control device 10 is described below. It is described in the context of a functioning of a switch connecting two batteries. This functioning is a non-limitative example.

At the Batteries:

In a first step INIT), in an initial state, the system described in FIG. 11 is idle and no current passes between the two batteries. This configuration corresponds to a vehicle stopped without any electrical consumer.

In a second step +APC), when the user turns the ignition key, a current (approximately 20 A) is consumed on the battery 3. This current produces a voltage drop at the terminals of the said battery and the control device 10 controls the transistor 5 so as to reduce the voltage drop.

In a third step +DEM), when the user starts the thermal engine by means of a starter or an alternator starter, the current is taken from the battery 2. This high current makes the voltage drop at the terminals of the battery 2 appreciably (from 12V to 6V for example). To avoid this voltage drop disturbing the onboard system connected to the battery 3, it is desirable for the control device 10 to open the transistor 5 quickly. Rapid control also protects the transistor 5 against a high current that might pass through it.

In a fourth step ALT), when the thermal engine is started, the alternator 6 or alternator starter supplies current to recharge the batteries 2 and 3, and the transistor 5 must close in order to avoid heating and to maintain the same charging voltages on the two batteries, without which the battery 2 would be more highly charged than the battery 3.

It should be noted that the feedback loop 16 acts in the following manner for the second +APC and fourth steps ALT. The feedback current, a function of the gate voltage Vg, is re-injected into the amplification device 15 so that the gain of the amplification device 15 is limited, around 1000, thus improving the stability of the control device. Thus, when the drain-source voltage Vds is around −30 mV, a switching of the transistor into two-state mode (Vgate-source=0V or Vcc) is all the more avoided and therefore oscillations are avoided. Thus the channel of the transistor 5 is made to vary by controlling the gate-source voltage Vgs according to the voltages Vds and Vgs (via the feedback loop 16).

For the first INIT and third +DEM steps, the feedback current Iret is zero, the gate-source voltage Vgs being zero.

Thus the protection devices presented above have the following advantages:

firstly, when the vehicle is stopped (ignition cut), for example on a car park for one month, this enables the power bridge of the alternator starter not to consume any current continuously; thus this avoids potential discharge of the battery;

this is because, with one or more protection diodes, as seen previously, no leakage current exists, whether the power bridge be off (vehicle stopped) or on (vehicle travelling);

moreover, with one or more switches, as seen previously, there exists no leakage current when the power bridge is off; however, a leakage current exists when the power bridge is on, which has no importance since at this moment the leakage current is negligible compared with the current output by the power bridge, that is to say approximately 50 A in the first application described;

secondly, the protection devices presented, diode or switch, afford protection against overvoltages at the point B presented on the various functional diagrams of the control device;

thirdly, in the case where a stability capacitor exists in the feedback loop, the said capacitor generally discharging from 12V to 0.7V, a protection diode affords rapid discharge of the said capacitor when its input (12V) changes sign;

fourthly, cancelling out the leakage currents makes it possible to be in agreement with certain manufacturing standards that require a total leakage current of 100 micro-amperes;

fifthly, preventing leakage currents has another advantage of preventing oxidation of the phases of the stator of the alternator in the case of the power bridge application, the alternator being in an often moist environment favouring corrosion. This is because, when leakage currents are present, a difference in potential exists between the phases and the casing of the alternator connected to the vehicle earth;

sixthly, it can be seen that producing the control device is simple and therefore can easily be integrated in an ASIC integrated circuit or directly on the same substrate as the MOS power transistor. It is also possible to put several control devices on the same substrate or in the same ASIC in order to control several MOS transistors (for example a device that controls a power bridge arm, or all the arms of the bridge etc).

The invention claimed is:

1. A MOSFET power transistor in combination with a control device for controlling the power transistor; the power transistor comprising a gate, a source and a drain; the control device comprising:

an amplification device (15) comprising a negative first input (NEG), a positive second input (POS) and an output;

a first resistor (R9) and a second resistor (R18);

the amplification device controlling the gate of the power transistor through an output control signal emitted by the output of the amplification device (15);

the negative first input (NEG) connected to the drain of the power transistor through the first resistor (R9) and forming a first connection; and the positive second input (POS) connected to the source of the power transistor by a second connection;

a feedback loop between the output of the amplification device (15) and the negative first input (NEG) thereof, the feedback loop including the second resistor (R18);

a leakage protection device provided to prevent passage of a leakage current through the power transistor and the control device, the current being able to discharge a supply source connected to the power transistor and the control device;

the leakage protection device comprising a first one-way semiconductor element (D4), a second one-way semiconductor element (D9) and a third one-way semiconductor element (D3) inserted in series in the first connection, the feedback loop and the second connection of the amplification device (15), respectively;

the direction of insertion of each of the one-way semiconductor elements (D3, D4, D9) being determined such as to prevent the passage of the leakage current;

the number of the one-way semiconductor elements (D3, D4) inserted in the first and second connections being determined such as to have the same number N of semiconductor junctions between the first and second connections.

2. The combination according to claim 1, wherein the control device is implemented in an integrated circuit (ASIC).

3. The combination according to claim 1, wherein the number of semiconductor junctions N is equal to 1.

4. A control system for managing two batteries for a motor vehicle, comprising a first combination and a second combination according to claim 1; the first and second combinations provided to put the batteries in parallel.

5. A power bridge for a polyphase rotary electrical machine comprising at least one bridge arm including MOSFET power transistors and an associated control device (10) for each of the transistors; the at least one bridge arm being associated with a phase of the machine; the transistors and the control device forming the combination according to claim 1.

6. A rotary electrical machine comprising a control system for managing two batteries according to claim 4.

7. A rotary electrical machine comprising a power bridge according to claim 5.

8. The combination according to claim 1, wherein the control device (10) comprises first (I1) and second (I2) supply sources, which are designed to polarize said first (D3) and second D4) one-way semiconductor elements.

9. The combination according to claim 1, wherein the one-way semiconductor elements (D4, D9 and D3) are diodes.

* * * * *